US008614052B2

(12) United States Patent
Galler

(10) Patent No.: US 8,614,052 B2
(45) Date of Patent: Dec. 24, 2013

(54) METHOD FOR CONTROLLING THE ELECTRONIC BEAM EXPOSURE OF WAFERS AND MASKS USING PROXIMITY CORRECTION

(75) Inventor: Reinhard Galler, Weimar (DE)

(73) Assignee: EQUIcon Software GmbH Jena, Jena (DE)

(*) Notice: Subject to any disclaimer, the term of this patent is extended or adjusted under 35 U.S.C. 154(b) by 0 days.

(21) Appl. No.: 13/522,743

(22) PCT Filed: Jan. 12, 2011

(86) PCT No.: PCT/DE2011/000021
§ 371 (c)(1),
(2), (4) Date: Jul. 26, 2012

(87) PCT Pub. No.: WO2011/085719
PCT Pub. Date: Jul. 21, 2011

(65) Prior Publication Data
US 2012/0293787 A1 Nov. 22, 2012

(30) Foreign Application Priority Data

Jan. 18, 2010 (DE) .......................... 10 2010 004 939

(51) Int. Cl.
*G03F 1/20* (2012.01)
*H01J 37/317* (2006.01)
(52) U.S. Cl.
USPC ................. 430/296; 430/5; 430/30; 430/942; 716/53
(58) Field of Classification Search
USPC ........................... 430/5, 30, 296, 942; 716/53
See application file for complete search history.

(56) References Cited

U.S. PATENT DOCUMENTS

| 5,241,185 A | 8/1993 | Meiri et al. |
| 6,107,207 A | 8/2000 | Waas et al. |
| 2008/0067446 A1 | 3/2008 | Belic et al. |

FOREIGN PATENT DOCUMENTS

| DE | 4317899 C2 | 2/1995 |
| DE | 19818440 C2 | 10/1999 |

OTHER PUBLICATIONS

Galler R et al: "Geometrically Induced Dose Correction Method for e-Beam Lithography Applications", Proceedings of the SPIE—The International Society for Optical Engineering SPIE—The International Society for Optical Engineering USA, vol. 7823, Sep. 24, 2010, XP002633885, ISSN: 0277-786X, the whole document.

Galler R et al: "Modified Dose Correction Strategy for better Pattern Contrast", Proceedings of the SPIE—The International Society for Optical Engineering SPIE—The International Society for Optical Engineering USA, vol. 7545, May 15, 2010 XP002633886, ISSN: 0277-786X, the whole document.

Eunsung Seo et al: "Dose and shape modification proximity effect correction for forward-scattering range scale features in electron beam lithography", Japanese Journal of Applied Physics, Part 1 (Regular Papers, Short Notes & Review Papers) Japan Soc. Appl. Phys. Japan, vol. 39, No. 12B, Oct. 11, 2000, pp. 6827-6830, XP002633887, ISSN: 0021-4922, cited in the application—the whole document.

Eisenmann H et al: "Proximity correction of high dosed frame with PROXECCO", Proceedings of the SPIE—The International Society for Optical Engineering USA, vol. 2194, Mar. 1, 1994, pp. 310-317, XP002633888, ISSN: 0277-786X the whole document.

Manakli S et al: "Complementary dose and geometrical solutions for electron beam direct write lithography proximity effects correction: Application for sub- 45-nm node product manufacturing", Aug. 13, 2007, Journal of Micro/ Nanolithography, MEMS, and MOEMS Oct. 2007 SPIE US, vol. 6, No. 3, XP002633889, the whole document.

Osawa Morimi et al: "Proximity effect correction using pattern shape modification and area density map for electron-beam projection lithography", Journal of Vacuum Science and Technology: Part B, AVS / AIP, Melville, New York, NY, US, vol. 19, No. 6, Aug. 20, 2001, pp. 2483-2487, XP012009068, ISSN: 1071-1023, DOI: DOI:10.1116/1.1410090, the whole document.

Galler R et al: "A solution to meet new challenges on EBDW data prep", Proceedings of the SPIE—The International Society for Optical Engineering SPIE—The International Society for Optical Engineering USA, vol. 7470, Jan. 15, 2009, XP002633890, ISSN: 0277-786X the whole document.

Kratschmer, E. "Verification of a proximity effect correction program in electron-beam lithography" Institute of Semiconductor Electronics, Aachen Technical University, 5100 Aachen, Germany J. Vac. Sci. Technol. (19) 1981, 1264-68.

Kato, T. et al. "Proximity effect correction in electron-beam lithography" LSI Research and Development Laboratory, Mitsubishi Electric Company, Itami, Hyogo, Japan J. Vac. Sci. Technol. (19) 1981, 1279-1285.

International Preliminary Report on Patentability dated Aug. 7, 2012.

*Primary Examiner* — Christopher Young
(74) *Attorney, Agent, or Firm* — Stephan A. Pendorf; Patent Central LLC

(57) ABSTRACT

A method of electron beam lithography for producing wafers and masks. To reduce the impacts of the disturbing proximity effect, an expanded correction algorithm that enables a more accurate correction is used to control the electron beam. To create an improved correction method by means of which the contrast and the feature width (CD) of all figures of a pattern can be optimally controlled additional contrast frames (KR) and remaining figures (R) are produced using a geometric method for the purpose of contrast control with respect to all figures (F). Then smaller figures (KRsize-S and Rsize-S) are produced from the contrast frame figures (KR) and remaining figures (R) by means of a negative sizing operation, and subsequently figures (KRsize-S and Rsize-S) are transferred to the proximity correction algorithm with the condition that the resist threshold is reached at the edges of the figures (KR, R) by the dose assignment.

5 Claims, 4 Drawing Sheets

Contrast gradient in dependence on line width at a duty cycle of 1:1 (1:4)

Line width

F

F  KR  $R_{size-s}$  $KR_{size-s}$

METHOD FOR CONTROLLING THE ELECTRONIC BEAM EXPOSURE OF WAFERS AND MASKS USING PROXIMITY CORRECTION

The invention relates to a method of electron beam lithography for producing wafers and masks. In order to reduce the impacts of the disturbing proximity effect, an expanded correction algorithm that enables a more accurate correction is used to control the electron beam.

BACKGROUND OF THE INVENTION

Methods for producing patterns by means of an electron beam exposure device have been known in the art for a long time. The required pattern is broken down into small elementary figures and projected onto a layer of photosensitive dye. After development of the resist the pattern should be imaged in the resist as accurately as possible. The exposure of a resist with an electron beam of a certain shape (Gaussian profile beam or shaped beam or multi-pixel beam) produces a dose distribution in the resist which does not correspond to the dose profile for the electron beam. The reason for that is the scattering of the electrons by the atoms or molecules of the resist and the substrate. This is called the proximity effect.

There a short range effect (ca. 20 nm . . . 40 nm, forward-scattering) and a considerably longer range effect (ca. 5,000 nm . . . 30,000 nm, back-scattering) occur. Said effects result in a widening of the electron beam ("smearing of the dose distribution") and a mutual interference of the dose distributions of different elementary figures, so that in the end, if all desired elementary figures are exposed with the same dose and unchanged geometry, the dose distribution produced in the resist is so distorted that the structures produced in the resist do not have the CDs of the desired pattern. Usually the pattern produced becomes useless for the desired purpose. To correct this effect, a mathematical model of the proximity effect must first be developed.

It is widely accepted that the effect can be described as a superposition of two Gaussian functions (Formula (1)), wherein alpha and beta represent the forward- and back-scattering ranges and eta describes the ratio of one effect to the other.

Formula 1

$$f(r) = \frac{1}{\pi(1+\eta)} \left( \frac{1}{\alpha^2} e^{\frac{r^2}{\alpha^2}} + \frac{\eta}{\beta^2} e^{-\frac{r^2}{\beta^2}} \right)$$

This function is also called the Point Spread Function (PSF). To utilize it in a not-yet-determined correction method, the parameters a and b have to be determined. For this purpose, exposures with predefined test patterns are carried out using various methods and the CDs of the figures are measured on the test patterns in the resist. However, the results of these measurements include not only the PSF but also other influences which are thus included in the calibration.

Said influences are, in particular, the so-called beam blur caused by Coulomb interaction between the electrons and lens aberrations in the electromagnetic imaging systems, as well as effects during exposure and development caused by the chemical properties of the resist. For this reason, the function calibrated over the entire process will be hereinafter called "Process Proximity Function" (PPF). In defining the PPF it may be necessary to superpose more than two Gaussian functions.

The resulting dose distribution can then be calculated as the result of the convolution operation of the PPF with the pattern itself. As can be easily seen, said function is radially symmetric, position-independent and monotonically decreasing towards the outside.

To ensure that the resist pattern produced by electron beam lithography is usable, the proximity effect, which is unavoidable (for physical reasons), must be corrected. The usual procedure in an electron beam exposure device that supports dose control of the electron beam is to cut the figures of the pattern into smaller figures and to calculate individual doses for said smaller figures until it is ensured that the figures of the pattern have the desired CD after completion of the entire process (exposure and development of the resist).

A method with dose and geometry correction that is suitable for any pattern is described in DE 4317899 C2 and implemented in the known and commercially available PROXECCO software. This method is based on the mathematical technique of "deconvolution by suitable Fourier transforms", hereinafter referred to in brief as "deconvolution". A further method is disclosed in DE 198 18440 C2.

All correction methods in accordance with the state of the art suffer from some problems. The proximity correction methods known to us work satisfactorily only as long as the CDs of the figures in the pattern are greater than approximately 1.3 times the alpha parameter (cf. Seo) of the PPF. The current state of the art in semiconductor technology, however, requires CDs of about 35 nm, and by 2016 even 22 nm will be required (ITRS Roadmap). Lithography processes which are currently available and applicable in semiconductor production have (in particular due to the resists belonging to the respective process) an alpha parameter of about 25 . . . 30 nm, i.e. direct exposure is only possible down to about 38 . . . 45 nm. A number of suggestions for further improving the imaging quality in existing processes are known in the art, cf. for example US-PS 2008/0067446 A1. All of these suggestions for improving the correction begin with modifying the correction algorithm based on "deconvolution" and have so far not succeeded in improving quality significantly.

OBJECT OF THE INVENTION

The object of the invention is therefore to create an improved correction method by means of which the contrast and the feature width (CD) of all figures of a pattern can be optimally controlled.

Another object of the invention is to design this correction method independently of a particular correction algorithm known in the art and the way the PPF is described.

The problem is solved according to the present invention by the features of claim 1.

This new method is based on the following considerations and findings.

It follows from the model of the proximity effect that for a very special pattern it is possible to calculate the correction of the proximity effect without resorting to the mathematical apparatus of "deconvolution". Said pattern is a pattern of equally spaced lines and gaps extending infinitely in both dimensions of a plane.

When calculating the dose it becomes apparent that the relative corrected dose for the line figures always equals 1.0 independently of both line width and concrete PPF. If an arbitrary PPF is then employed for calculating the resulting dose distribution (Seo, Mack) (i.e. for simulating the dose distribution), which is again possible without the mathematical apparatus of convolution, it becomes apparent that the resist contrast finally disappears only at 0.65 times the alpha parameter (cf. FIG. 1).

Assuming a dense line pattern it is thus completely impossible to image smaller structures. However, experiments show (Seo) that the imaging limit is already reached at about 1.3 times the alpha parameter in practice. Since this outcome occurs independently of correction and calibration and hence neither the correction nor the calibration can be incorrect, all attempts at improving the imaging in this range by way of different correction algorithms or calibration of the PPF are inevitably doomed to failure.

The cause of the problem is that all methods known in the art try to obtain the "right" CD, i.e. the CD before the imaging, by controlling the CD of the figures after the imaging (CD control). In the above-mentioned range from about 0.64 alpha to 1.3 alpha a CD control is not sufficient and must be supplemented by a contrast control. Even if the contrast of the pattern (the contrast between "figure" and gap is always=1.0 in the pattern data to be imaged) cannot be reached, the available contrast must be maximized to attain an image in the respective range.

For this reason the method of geometrically induced dose correction is introduced. In this method the contrast is controlled by the sizing parameter S (cf. FIG. 2).

The size of a figure is reduced by the value S (e.g. 10 nm) in both x and y direction via a sizing operator. Subsequently the dose assigned to the figure is corrected using the PPF of the exposure process such that said exposure process produces exactly the line width of the original figure. The curves in FIG. 2 show that the line width is indeed always the same but the contrast and in particular the gradient of the contrast at the resist threshold position increase when the sizing parameter increases.

This method obviously works well with test patterns consisting of figures of equal line width but is not yet sufficient for controlling the contrast of general patterns. General patterns contain not only figures of a certain size but always a mixture of figures of many different sizes.

It has now been discovered that all PPFs have a turnover point regarding the contrast in dependence on the width of the figure. Said point is located at approximately 2.5 times the alpha parameter of the PPF (cf. FIG. 3).

The new procedural steps have been derived from the discovery of this physical fact.

The introduction of the contrast stamp width K as a new parameter is essential in this context.

The new method of claim 1 facilitates highly accurate imaging of all figures in a pattern by simultaneously controlling contrast and CDs during the electron beam exposure.

Further preferred process variants of the individual steps of the method are included in subclaims 2 to 4.

Subclaim 5 demonstrates a process variant facilitating the detection of small gaps in large figures. This reliably prevents the skipping of small gaps during processing of the correction algorithm.

EXAMPLES

In the following, the method will be explained with reference to an example.

Figure 1:
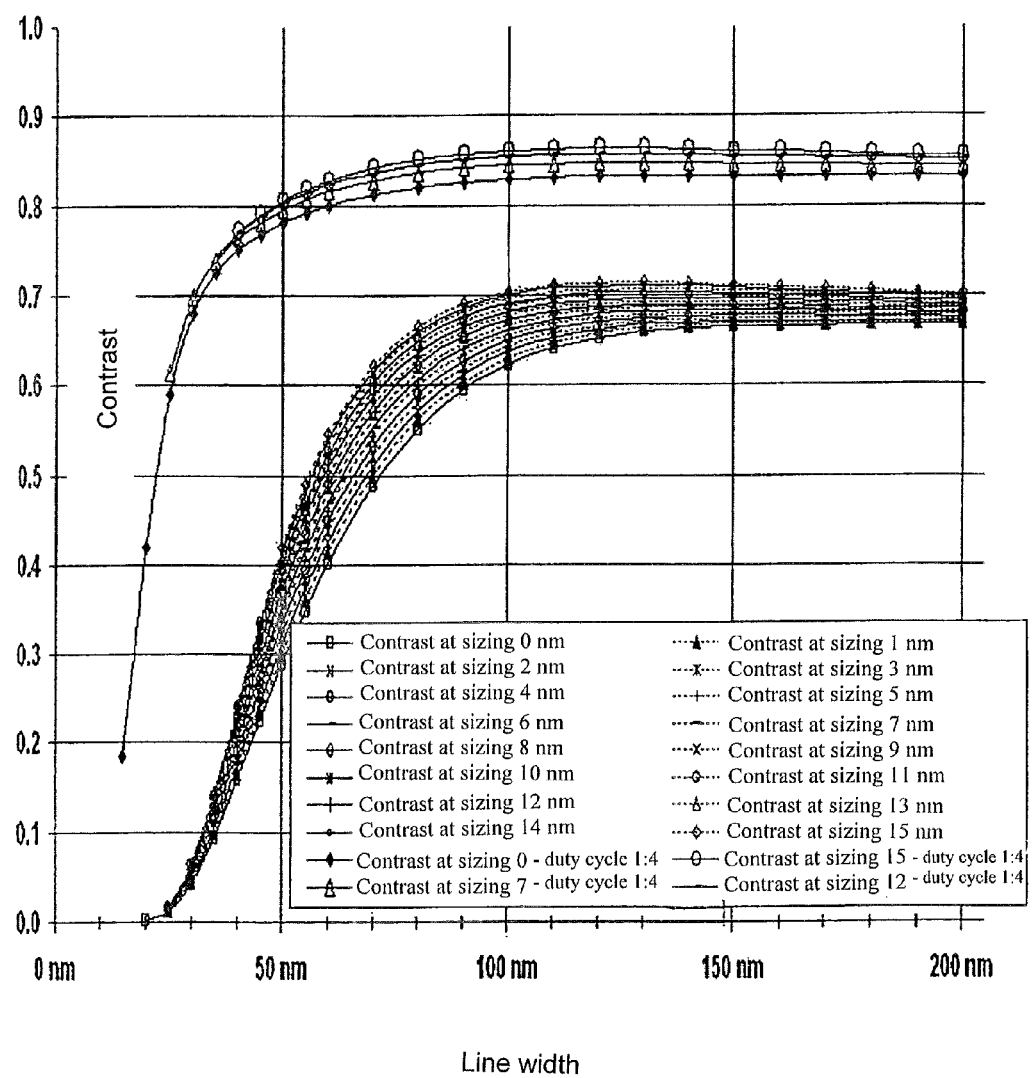
FIG. 1 shows a diagram of the contrast gradient in dependence on line width.
Figure 2:
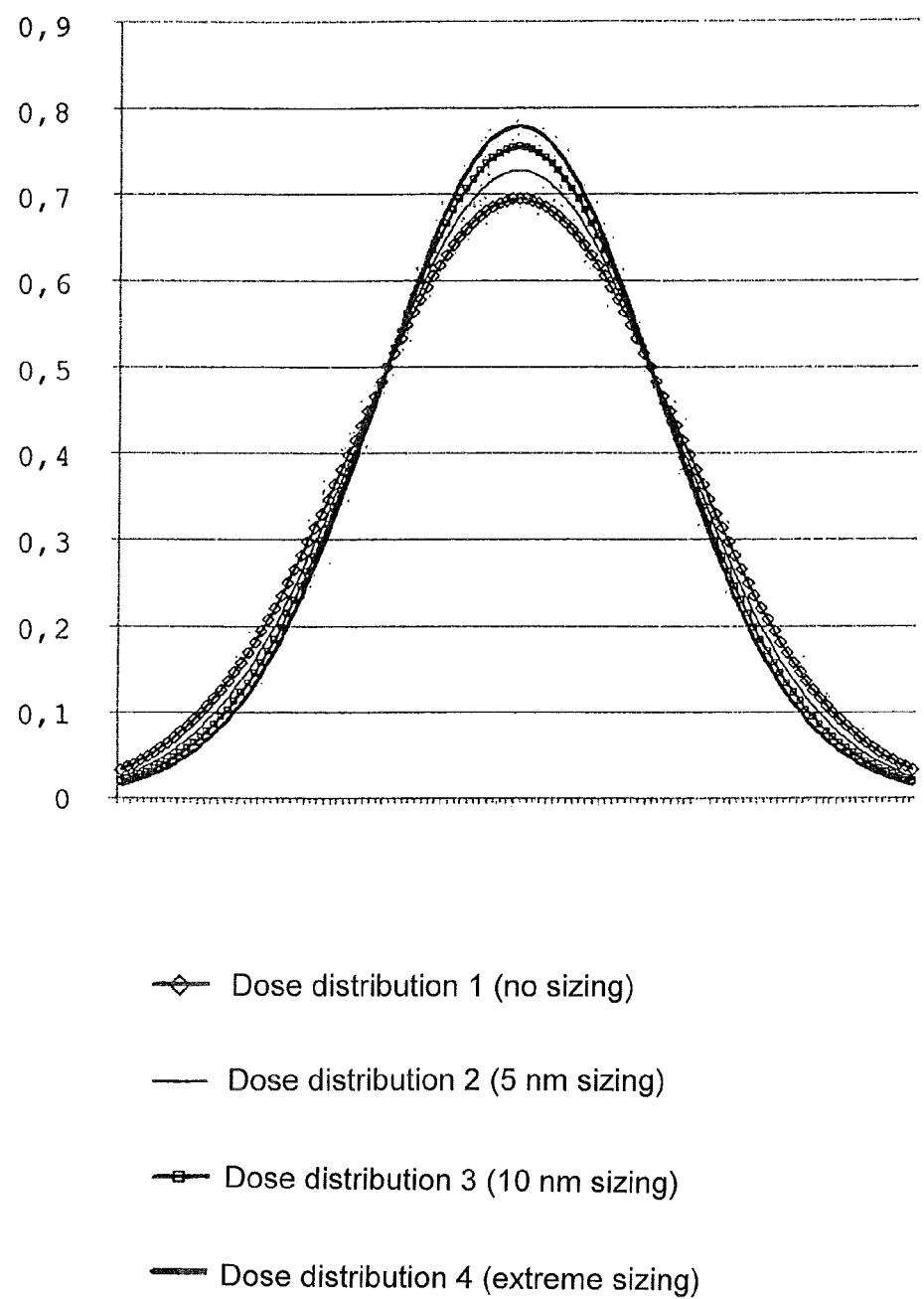
FIG. 2 shows the dose distribution for different sizing parameters.
Figure 3:
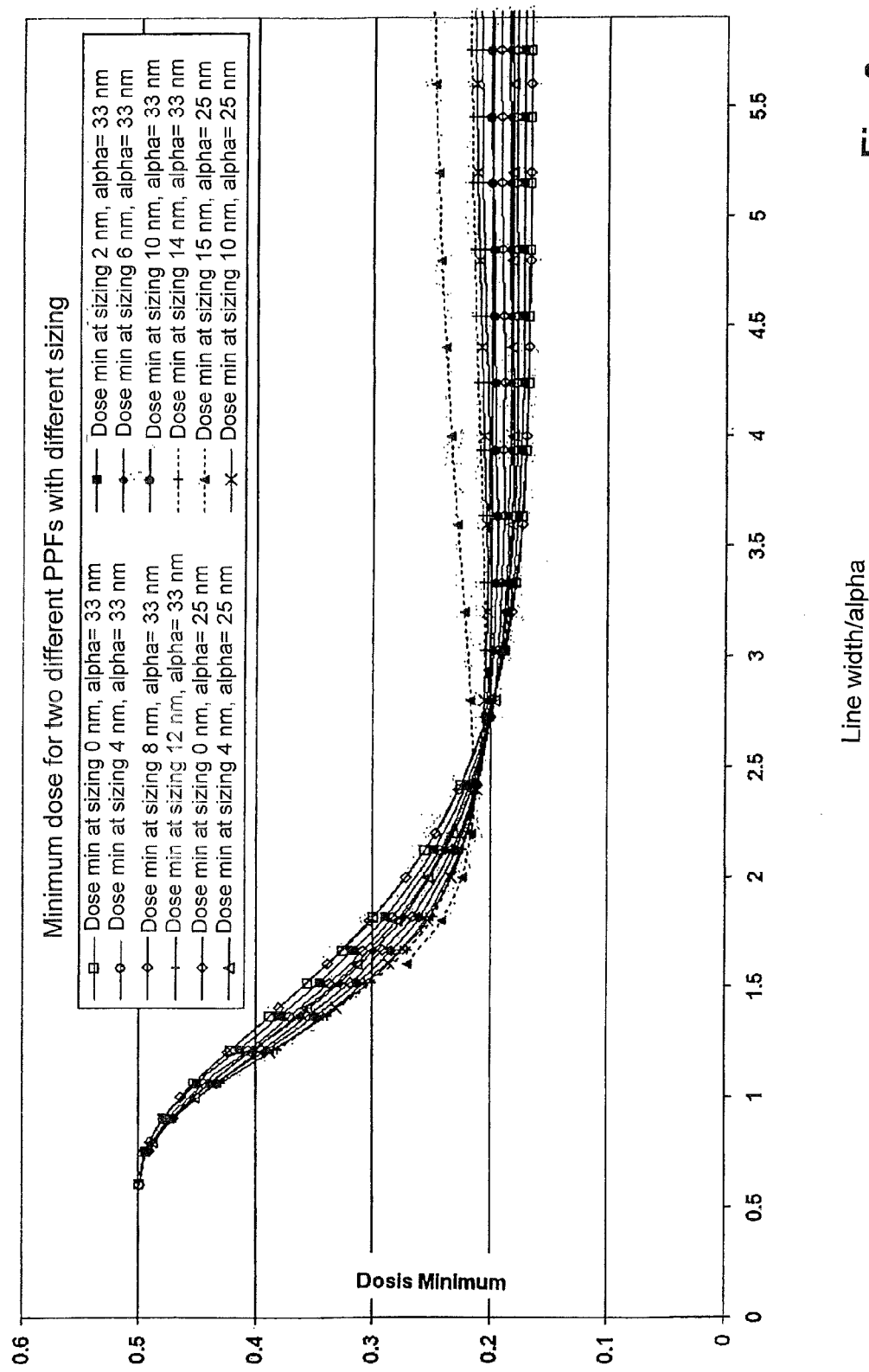
FIG. 3 illustrates the progression of minimum dose and contrast.
Figure 4:
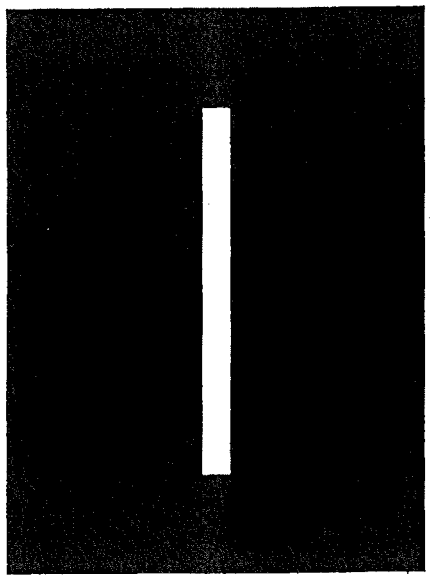

FIG. 4 contains the principle schematics of a pattern with the figure F, and

Figure 5:
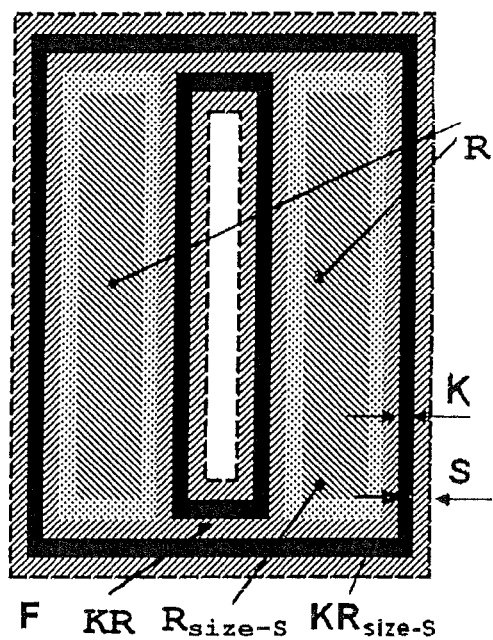

FIG. 5 shows the transformation of F into KR and R.

The figure F in the form of a rectangle with an embedded line-shaped gap as shown in FIG. 4 may serve as an example of arbitrarily complex figures of a pattern. In a first operation, the remaining figure R is produced from F. This is achieved by means of a negative sizing operation by the value (2×S+K). The contrast frame KR is produced by means of the geometric subtraction of the remaining figures R from the figures F: KR=F\R.

Then the resulting figures contrast frame KR and remaining figure F are each reduced to $KR_{size-S}$ and $R_{size-S}$ by the value of S by means of a negative sizing operation. $KR_{size-S}$ and $R_{size-S}$ are then transferred concurrently to the proximity correction algorithm with the condition that the respective doses are assigned such that the resist threshold is exactly reached at the edges of figure KR and that it is guaranteed to be exceeded for the area of figure R.

REFERENCE SYMBOL LIST

CD feature width
F figures
K contrast stamp width
KR contrast frame
$KR_{size-S}$ reduced KR
R remaining figures
$R_{size-S}$ reduced R
S sizing parameter

NON-PATENT LITERATURE

E. Seo, O. Kim, "Dose and Shape Modification Proximity Effect Correction for Forward Scattering Range Scale Features in Electron Beam Lithography", Jpn. J. Appl. Phys. Vol. 39 (2000) pp. 6827-6830

C. Sauer, C. A. Mack, "Electron-beam lithography simulation for mask making, part IV: Effect of resist contrast on isofocal dose", Photomask and X-Ray Mask Technology VI, Proc. SPIE Vol. 3748 (1999)

The invention claimed is:

1. A method for controlling the electron beam exposure of wafers and masks using proximity correction through a correction algorithm, wherein
    additional contrast frames (KR) and remaining figures (R) are produced using a geometric method for the purpose of contrast control with respect to all figures (F),
    smaller figures ($KR_{size-S}$ and $R_{size-S}$) are produced from the contrast frame figures (KR) and remaining figures (R) by means of a negative sizing operation,
    and subsequently said figures ($KR_{size-S}$ and $R_{size-S}$) are transferred to the proximity correction algorithm with the condition that the resist threshold is reached at the edges of the figures (KR, R) due to the dose assignment.

2. The method of claim 1, wherein the geometric method consists of the following steps:
    a remaining figure (R) is produced from the figure (F) by means of a negative sizing operation by the value 2× sizing parameter (S)+contrast stamp width (K),
    the contrast frame (KR) is produced by means of the geometric subtraction of the remaining figure (R) from the figure (F), and the resulting figures (R and KR) are then reduced to $KR_{size-S}$ and $R_{size-S}$ by the value of the sizing parameter (S) by means of a negative sizing operation.

3. The method of claim 1, wherein the contrast frame (KR) has a total width of one contrast stamp width (K)+2× sizing parameter (S), wherein the width of the contrast frame (KR) <$CD_{min}$ and the double width of the contrast frame (KR)<2.5 alpha ($\alpha$) and the respective optimal method of geometrically induced dose correction results automatically for all figures with a width<2.5 alpha ($\alpha$).

4. The method of claim 1, wherein the remaining figures (R) are transferred to the proximity correction algorithm with the condition that a dose is assigned only to such extent that the resist threshold is guaranteed to be exceeded for all the remaining figures (R).

5. The method of claim 1, wherein the reliable detection of small gaps in large figures (inverted figures embedded in large figures) is ensured by passing the original pattern and the inverted pattern produced by tone value inversion to the correction algorithm simultaneously and by taking both tone values into account when breaking the patterns down into elementary figures and assigning the corrected dose to said elementary figures.

\* \* \* \* \*